US008164937B2

(12) United States Patent
Norman

(10) Patent No.: US 8,164,937 B2
(45) Date of Patent: Apr. 24, 2012

(54) DIGITAL POTENTIOMETER USING THIRD DIMENSIONAL MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 298 days.

(21) Appl. No.: 12/653,897

(22) Filed: Dec. 18, 2009

(65) Prior Publication Data

US 2010/0157659 A1 Jun. 24, 2010

Related U.S. Application Data

(60) Provisional application No. 61/203,446, filed on Dec. 22, 2008.

(51) Int. Cl.
*G11C 5/06* (2006.01)
(52) U.S. Cl. ............. 365/63; 365/51; 365/148; 365/226
(58) Field of Classification Search .................... 365/51, 365/63, 148, 226
See application file for complete search history.

(56) References Cited

U.S. PATENT DOCUMENTS

| 5,717,935 A | * | 2/1998 | Zanders et al. | ............... 713/300 |
| 7,005,837 B2 | * | 2/2006 | Stanescu et al. | ............... 713/300 |
| 7,652,501 B2 | * | 1/2010 | Norman | ......................... 326/40 |

* cited by examiner

*Primary Examiner* — VanThu Nguyen

(57) ABSTRACT

A digital potentiometer using third dimensional memory includes a switch configured to electrically couple one or more resistive elements with a first pin and a second pin, and a non-volatile register configured to control the switch. In one example, the non-volatile register can include a BEOL non-volatile memory element, such as a third dimensional memory element. The non-volatile register can include a FEOL active circuitry portion that is electrically coupled with the BEOL non-volatile memory element to implement the non-volatile register. The resistive elements can be BEOL resistive elements that can be fabricated on the same plane or a different plane than the BEOL non-volatile memory elements. The BEOL non-volatile memory elements and the BEOL resistive elements can retain stored data in the absence of power and the stored data can be non-destructively determined by application of a read voltage.

19 Claims, 14 Drawing Sheets

US 8,164,937 B2

DIGITAL POTENTIOMETER USING THIRD DIMENSIONAL MEMORY

FIELD OF THE INVENTION

Various embodiments of the invention relate generally to semiconductors and memory technology, and more specifically, to a digital potentiometer using third dimensional memory.

BACKGROUND

Since the first days of electronics, analog adjustments in resistances for some circuit and system designs have typically been necessary. Initial conventional techniques involved making resistive adjustments by physically replacing resistors and swapping resistor values on circuit boards, which was a typically slow, laborious process that was prone to reliability issues. Later, other conventional approaches included the use of adjustable potentiometers that altered resistance values by changing a mechanical setting, such as turning a shaft that altered the contact points. However, these mechanically adjustable potentiometers still required manual intervention to calibrate settings to obtain the desired resistance value. As such, setting the resistance value was still a manual process, which typically was slow, labor intensive, and relatively prone to error. These adjustable potentiometers usually were also subject to resistive changes caused by vibration.

Integrated circuit technology has enabled potentiometers to digitally select establish variable resistive paths. Once a specific resistance is set, the settings for the resistive path are made permanent. Using conventional techniques, this can be done by setting select pins to a particular value or by programming the settings using fuse or non-volatile technology, such as EEPROM technology, to store the value. While digitally selectable techniques remove the manual-related processes, conventional implementations of non-volatile methodology typically require high voltages that, in turn, require large charge pumps, which consume relatively large amounts of die area. Typically, EEPROM technology has a relatively higher failure rate than is desired. In addition, the programming time for typical non-volatile memory technologies is relatively long, thereby hindering the rates at which resistances are adjusted and set. Further, in conventional techniques, the resistance values are set by design, which is typically limited to combinations of discrete resistance values.

There are continuing efforts to improve digital potentiometer technology.

BRIEF DESCRIPTION OF THE DRAWINGS

Various examples are disclosed in the following detailed description and the accompanying drawings.

Figure 1A:
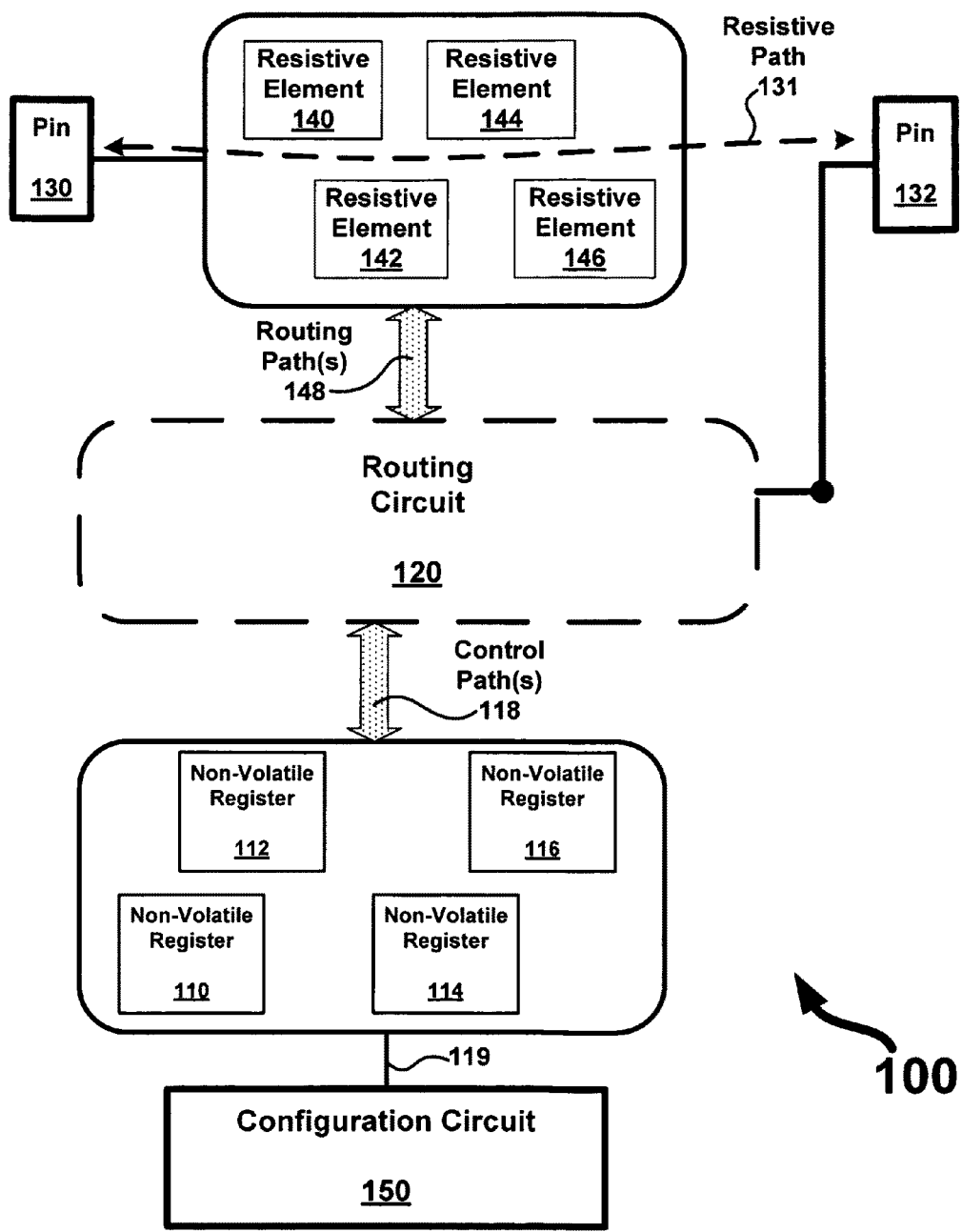
FIG. 1A depicts an example of a digital potentiometer, according to one or more embodiments of the invention.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments, and examples thereof, may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description is provided below along with accompanying figures. The detailed description is provided in connection with examples of various embodiments, but is not limited to any particular example. The scope is limited only by the claims, and numerous alternatives, modifications, and equivalents are encompassed. Numerous specific details are set forth in the following description in order to provide a thorough understanding. These details are provided as examples of the various embodiments and the described techniques may be practiced according to the claims without some or all of the accompanying details. For clarity, technical material that is known in the technical fields related to the examples has not been described in detail to avoid unnecessarily obscuring the description.

In examples of various embodiments, a digital potentiometer may be formed to include or interact with memory elements, for example, in multiple layers of memory or that store data as a function of resistance, or both, as well other equivalent structures and/or functionalities. As used herein, the term "memory element" can refer, at least in one embodiment, to a non-volatile memory cell or cells, as well as material and/or structures capable of storing data. In some examples, a memory element can be a two-terminal element. Multiple layers of these memory element structures may be stacked to achieve relatively high density.

FIG. 1A depicts an example of a digital potentiometer, according to one or more embodiments of the invention. U.S. patent application Ser. No. 12/005,685, filed Dec. 28, 2007, published as U.S. Pub. No. 2009/0172350, and entitled "Non-Volatile Processor Register", is herein incorporated by reference in its entirety and for all purposes, describes non-volatile registers. Here, structure 100 is representative of a digital potentiometer (or portions thereof) that include non-volatile registers 110-116, one or more routing paths 148, routing circuit 120, one or more control paths 118, pin 130, pin 132, resistive elements 140-146, and configuration circuit 150. Non-volatile registers 110-116 may be used to form a resistive path, which is shown conceptually as resistive path 131, between pin 130 and pin 132. In operation, non-volatile registers 110-116 may control routing circuit 120 to determine one or more routing paths 148. For instance, one or more of non-volatile registers 110-116 may be programmed to provide a desired combination of resistive elements 140-146 to determine a resistance of the resistive path between pin 130 and pin 132. In some examples, resistive elements 140-146 may be electrically coupled in series. In other examples, resistive elements 140-146 may be electrically coupled in parallel. In yet other examples, a subset of resistive elements 140-146 may be electrically coupled in parallel and another subset of resistive elements 140-146 may be electrically coupled in series. In various examples, a multitude of different combinations of resistive elements 140-146 may be implemented to create resistive path 131 with a desired resistance value. In other embodiments and examples, structure 100 and the above-described elements may be varied and are not limited to the functions, structures, configurations, or implementations provided.

In one example, a digital potentiometer may use third dimensional memory composed of third dimensional memory elements. U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½−VW1 to the Y-direction line), the memory cell can switch to a low resistive state. When a second write voltage, VW2, is applied across the memory cell (e.g., by applying ½ VW2 to the X-direction line and ½−VW2 to the Y-direction line), the memory cell can switch to a high resistive state. Memory cells using electrolytic tunnel barriers and mixed valence conductive oxides can have VW1 opposite in polarity from VW2.

Figure 1B:
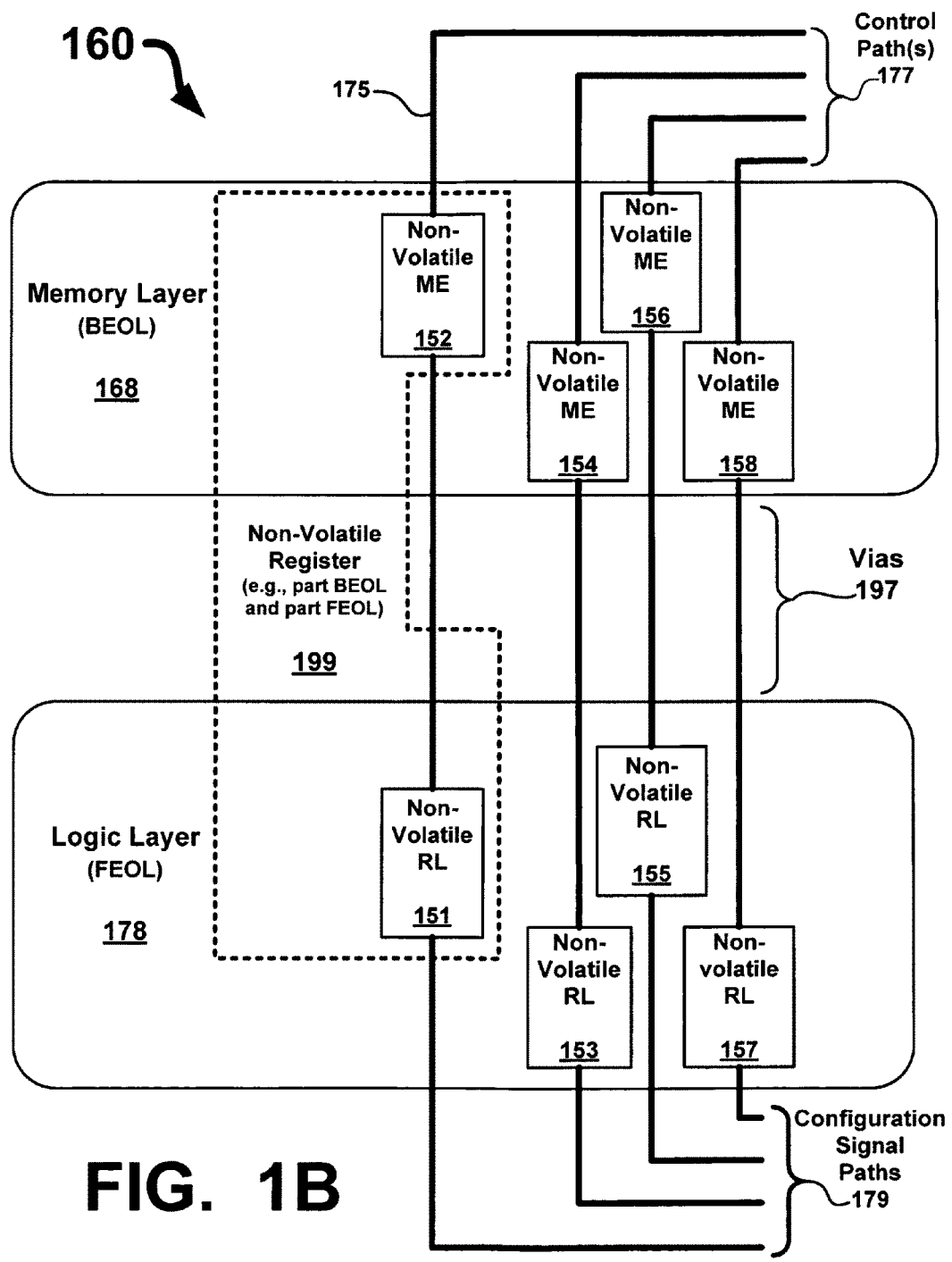
FIG. 1B depicts an example of a structure for the non-volatile registers of FIG. 1A, according to one or more embodiments of the invention.

FIG. 1B depicts an example of a structure for the non-volatile registers of FIG. 1A, according to one or more embodiments of the invention. Here, structure 160 includes non-volatile memory elements ("MEs") 152-158 in a memory layer 168 and non-volatile register logic ("RL") 151-157 in logic layer 178. The combination of non-volatile memory element and register logic can constitute a non-volatile register, according to various embodiments of the invention. For example, non-volatile memory element 152 and non-volatile register logic 151 can constitute a non-volatile register 199. As such, non volatile memory elements 154-158 can combine with non-volatile register logic 153-157, respectively, to form non-volatile registers (not shown) that are similarly to non-volatile register 199. In one embodiment, non-volatile memory elements 152-158 can be formed in memory layer 168 that can be vertically displaced (e.g., in the +Z direction) by one or more memory layers (not shown) from non-volatile register logic 151-157 in logic layer 178

(e.g., formed in the X and Y directions). In at least one instance, non-volatile memory elements 152-158 can be coupled by vias 197 to non-volatile register logic 151-157.

In various embodiments, non-volatile register 199 can be implemented with BEOL non-volatile third dimensional memory elements to control the selection of resistive elements 140-146 of FIG. 1A for creating resistive path 131 in a digital potentiometer. In operation, one or more control signals 179 can be applied to configure non-volatile register logic 151-157 and respective non-volatile memory elements 152-158. Non-volatile register logic 151-157 can be implemented FEOL as part of the active circuitry for logic layer 178. Accordingly, non-volatile registers, such as non-volatile register 199, can include a FEOL circuitry portion (e.g., non-volatile register logic) and a BEOL non-volatile memory portion (e.g., non-volatile third dimensional memory elements). For instance, non-volatile register 199 may be programmed by applying a voltage difference across a third dimensional memory element implemented as non-volatile memory element 152. After being configured, non volatile register 199 can provide control data along a path, such as path 175, as part of other control data communicated over control paths 177, which can be equivalent to control path(s) 118 of FIG. 1A, at least in some examples. For instance, the control data can represent logical values that can be used to include or exclude one or more of resistive elements 140-146 of FIG. 1A in resistive path 131. In various embodiments, non-volatile memory elements 152-158 and non-volatile register logic 151-157 may be equivalent in structure and/or function as described in U.S. patent application Ser. No. 12/012,641, filed Feb. 5, 2008, published U.S. Publication No. 2009/0196087, and entitled "Non-Volatile Register." In other examples, structure 160 and the above described elements may be varied and are not limited to the functions, structures, configurations, or implementations provided. More or fewer non volatile memory elements 152-158 and non-volatile register logic 151-157 can be used than is shown in FIG. 1B.

Referring back to FIG. 1A, an example of a digital potentiometer using structure 100 can be reprogrammable since non-volatile registers 110-116 can be reprogrammed. As such, the application of a voltage difference to one or more non-volatile registers can modify resistive path 131, thereby changing the resistance of the digital potentiometer. Thus, resistive path 131 for the digital potentiometer may be dynamically set in real-time, in accordance with various embodiments of the invention. Further, a digital potentiometer using the described structures and/or techniques can maintain the programmed settings, even through power cycles (e.g., powering down and powering up), since the registers are non-volatile. Thus, after the digital potentiometer has been programmed, non-volatile registers 110-116 of the digital potentiometer may be configured to select resistive path 131 instantaneous (or substantially instantaneous) to power-up. In addition, a digital potentiometer using the structures and/or techniques described herein need not use charge pumps to produce relatively high voltages, which, in turn, reduces circuitry costs, according to various embodiments of the invention. Also, further, the non-volatile register structure (or a portion thereof) may be placed above (or at a different layer than) a logic structure. In some examples, the logic structure may be formed using a CMOS (complementary metal-oxide-semiconductor) process, such as a known CMOS process, thereby enabling the non-volatile register structures (or portions thereof) to be added to, or integrated with, a CMOS process. In some examples, a portion of a non-volatile register structure may include one or more memory elements. Since structure 100 for a digital potentiometer can be formed BEOL above circuitry fabricated FEOL using a process (e.g., a CMOS process), digital potentiometers can be added to CMOS-based designs to provide real-time variable resistances, according to a number of embodiments of the invention. The digital potentiometers can be included with BEOL memory that is accessed for data operations by the FEOL active circuitry. Therefore, the BEOL memory can be used to implement digital potentiometers only or both digital potentiometers and non-volatile data storage.

Configuration circuit 150 can include logic configured to configure a subset of non-volatile registers 110-116 to determine a resistance for resistive path 131. In operation, configuration circuit 150 may generate and transmit configuration signals along configuration signal paths 119. In some examples, the configuration signals can include write and/or read voltage signals for programming non-volatile registers 110-116 to generate control data signals. One or more control data signals can be transmitted over control path(s) 118 to routing circuit 120. In response to the control data signals, routing circuit 120 may be configured to select one or more routing path(s) through which one or more of resistive elements 140-146 can be used to form restive path 131.

Figure 2:
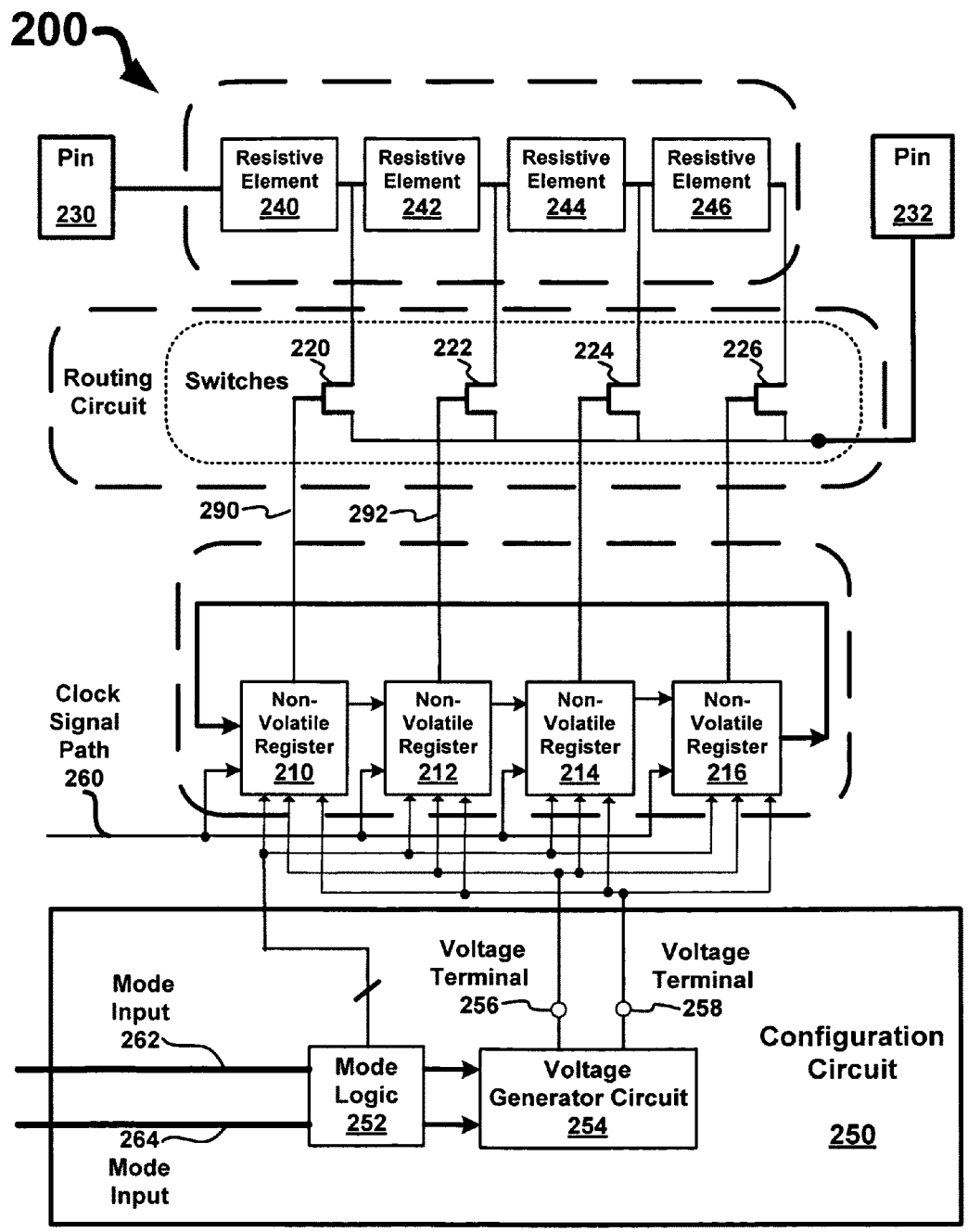
FIG. 2 depicts another example of a digital potentiometer, according to one or more embodiments of the invention.

In some examples, routing circuit 120 may include electronic switches. In other examples, routing circuit 120 can include transistors, as depicted in FIG. 2. In some examples, one or more of resistive elements 140-146 can include resistive memory element, such as third dimensional memory elements. That is, one or more of resistive elements 140-146 can be fabricated BEOL above active circuitry operative to access the resistive memory elements. In some examples, one or more resistive memory elements can have an adjustable resistance, while in other examples one or more resistive memory elements can have a static resistance value. In various embodiments, resistive elements 140-146 can include any material useable to form, for example, resistors. As used herein, the term "pin" can refer, at least in one embodiment, to a package pin, a port, a terminal, or the like. While FIG. 1A depicts four resistive elements 140-146, in other examples, there may be more or fewer resistive elements. Some of the various elements depicted in FIGS. 1A and 1B can be implemented using either hardware or software (e.g., firmware), or both. At least a portion of the hardware implementation can be implemented using FEOL circuitry.

FIG. 2 depicts another example of a digital potentiometer, according to one or more embodiments of the invention. Here, structure 200 may include non-volatile registers 210-216, switches 220-226 constituting a routing circuit (or portions thereof), pin 230, and pin 232, resistive elements 240-246, configuration circuit 250, which is shown to include mode logic 252 and a voltage generator circuit 254, voltages terminals 256-258, clock signal path 260, and mode inputs 262-264.

Non-volatile registers 210-216 may be used to set the resistive path between pin 230 and pin 232 by controlling corresponding switches 220-226. In some examples, switches 220-226 may be electronic switches. In other examples, switches 220-226 may be transistors, as shown in FIG. 2. By programming with specific information into non-volatile registers 210-216, the specific information can select the desired combination of resistive elements 240-246 to establish a resistive path (not shown) between pin 230 and pin 232.

To illustrate operation of structure 200, consider first that the resistance of resistive element 240 is to provide the resistance between pin 230 and pin 232. As such, configuration circuit 250 can configure, for example, non-volatile register 210 to generate a control data signal on path 290 to turn on switch 220 (i.e., switch 220 is activated), whereby the resistance of resistive element 240 can be represented as "R(240)." So while switch 220 is on, configuration circuit 250 can configure, for example, non-volatile registers 212-216 to generate a control data signal to turn off switches 222-226 (i.e., switches 222-226 are deactivated and do not conduct). Next, consider first that the resistances of resistive elements 240 and 242 can provide an aggregate resistance between pin 230 and pin 232. As such, configuration circuit 250 can configure non-volatile register 212 to generate a control data signal on path 292 to turn on switch 222 and to turn off switches 220, 224, and 226. Thus, the resistance between pin 230 and pin 232 is the resistance of resistive element 240 plus the resistance of resistive element 242 (i.e., R(240)+R(242)). In another illustration, consider that configuration circuit 250 causes non-volatile register 214 to turn on switch 224 (and turn off switches 220, 222, and 226. Thus, the resistance between pin 230 and pin 232 is the resistance of resistive element 240 plus the resistance of resistive element 242 plus the resistance of resistive element 244 (i.e., R(240)+R(242)+R(244)). Similarly, configuration circuit 250 may cause non-volatile register 216 to turn on switch 226 (and turn off switches 220-224). Thus, the resistance between pin 230 and pin 232 is the combined resistance of resistive element 240, resistive element 242, resistive element 244, and resistive element 246 (i.e., R(240)+R(242)+R(244)+R(246)).

As shown in this example, configuration circuit 250 includes mode logic 252 and a voltage generator circuit 254, both of which may be configured to configure a subset of non-volatile registers 210-216, which, in this example, are configured to operate as a ring counter. In this example, mode logic 252 controls the configuration of non-volatile registers 210-216 responsive to, for example, a clock signal on clock signal path 260 and mode inputs 262-264. Here, two mode inputs (e.g., mode input 262 and mode input 264) may be used to place configuration circuit 250 in one of four resistance configuration states (e.g., configuration state 00, configuration state 01, configuration state 10, and configuration state 11). For example, configuration state 00 may represent a state of normal operational use, configuration state 01 may represent a state in which non-volatile registers 210-216 are loaded with initial values of control data, configuration state 10 may represent a state in which control data is shifted through registers 210-216 by a clock signal on clock signal path 260, and configuration state 11 may represent a state where registers 210-216 are programmed. In the context of configuring a potentiometer, a configuration state can also be referred to as a state.

Mode logic 252 is configured to receive mode input 262 and mode input 264. When mode input 262 and mode input 264 are set to "0" and "1," respectively, mode logic 252 is in state 01. In state 01, mode logic 252 loads non-volatile register 210 with a logical value of one ("1"), and loads non-volatile registers 212-216 with zeroes ("0's", thereby setting up registers 210-216 to operate as a ring counter. During state 10, mode logic 252 is configured to cause voltage generator circuit 254 to apply write voltage signals to voltage terminal 256 and voltage terminal 248, both of which are applied to non-volatile registers 210-216. Next, when mode input 262 and mode input 264 are set to "1" and "0," respectively, mode logic 252 is configured to shift the control data in registers 210, 212, 214, and 216 to registers 212, 214, 216, and 210, respectively, during each clock signal. As such, the initial logical value of one loaded in non-volatile register 210 will not be shifted to non-volatile register 212, thereby leaving the logical value of one to turn on switch 220 to set the resistance of resistive element 240. The logical value of "1", as control data, can cycle through the subsequent registers each time clock signal path 260 is pulsed, until the desired resistance value is achieved. During state 01, mode logic 252 is configured to cause voltage generator circuit 254 to apply at least one read voltage signal to voltage terminal 256 (and voltage terminal 248 in some cases) to read the control data out from non-volatile registers 210-216, and then to write the control data into another of non-volatile registers 210-216 by applying write voltage signals to voltage terminal 256 and voltage terminal 248. When the desired resistance value is achieved, mode input 262 and mode input 264 are set to "1" and "1," respectively, to enable mode logic 252 to permanently store the values for the control data in non-volatile registers 210-216 until non-volatile registers 210-216 are reprogrammed. In this state, the values in registers 210-216 are used (i.e., without a shift operation) as the control data for programming. In state 11, mode logic 252 causes voltage generator circuit 254 to generate write voltages at voltages terminals 256-258 to program logical values of either "1" or "0" within non-volatile registers 210-216. Since this exemplary implementation is a ring counter, one of non-volatile registers 210-216 is programmed to include a "1," and the other non-volatile registers 210-216 are programmed to include a "0." After registers 210-216 are programmed, the resistance path has been selected and the programmed values are stored in non-volatile registers 210-216. To complete programming of the digital potentiometer, mode input 262 and mode input 264 are set to "0" and "0," respectively, mode logic 252 places structure 200 in normal operational mode. The register containing the "1" will turn on an associated switch to select a specific resistive path between pin 230 and pin 232.

In at least some embodiments, voltage generator circuit 254 may be configured to generate one or more write signals, including multiple write signals. To switch the memory element of a non-volatile register, such as a BEOL third dimensional memory element, into a relatively low resistive state, voltage generator circuit 254 may apply a first write voltage differential across the memory element via voltage terminals 256 and 258. For example, voltage generator circuit 254 can apply one-half of the magnitude of the first write voltage differential, with a positive polarity, to voltage terminal 256, and apply one-half of the magnitude of the first write voltage differential, with a negative polarity, to voltage terminal 258. Voltage terminals 256 and 258 can be coupled respectively to an X-line (or equivalent word line) and a Y-line (or equivalent bit line). To switch the memory element of a non-volatile register into a relatively high resistive state, voltage generator circuit 254 may apply a second write voltage differential, which can be of a different polarity than the first write voltage differential, across the memory element via voltage terminals 256 and 258.

While FIG. 2 depicts four resistive elements 240-246 in series, in other examples, there may be more or fewer resistive elements electrically coupled with pin 230 and pin 232 and the resistive elements may be electrically coupled in different configurations, such a series, parallel, series-parallel, or other combinations. Further, depending on the configuration of resistive elements 140-146, there may be more or fewer switches, with a corresponding number of non-volatile registers to control the switches. As used herein, the term "switch" may refer to an electronic switch, a transistor, an n-channel or p-channel device with appropriate pull-down and pull-up resistors, a pass gate, a transmission gate, and any other known electronic switching mechanisms. While FIG. 2 and other figures depict a transistor as the switch, other types of switching elements can be used, and, as such, various embodiments are not limited to the switching functions, structures, configurations, or implementations that are represented by transistors. In other examples, structure 200 and the above-described elements may be varied and are not limited to the functions, structures, configurations, or implementations provided.

Figure 3:
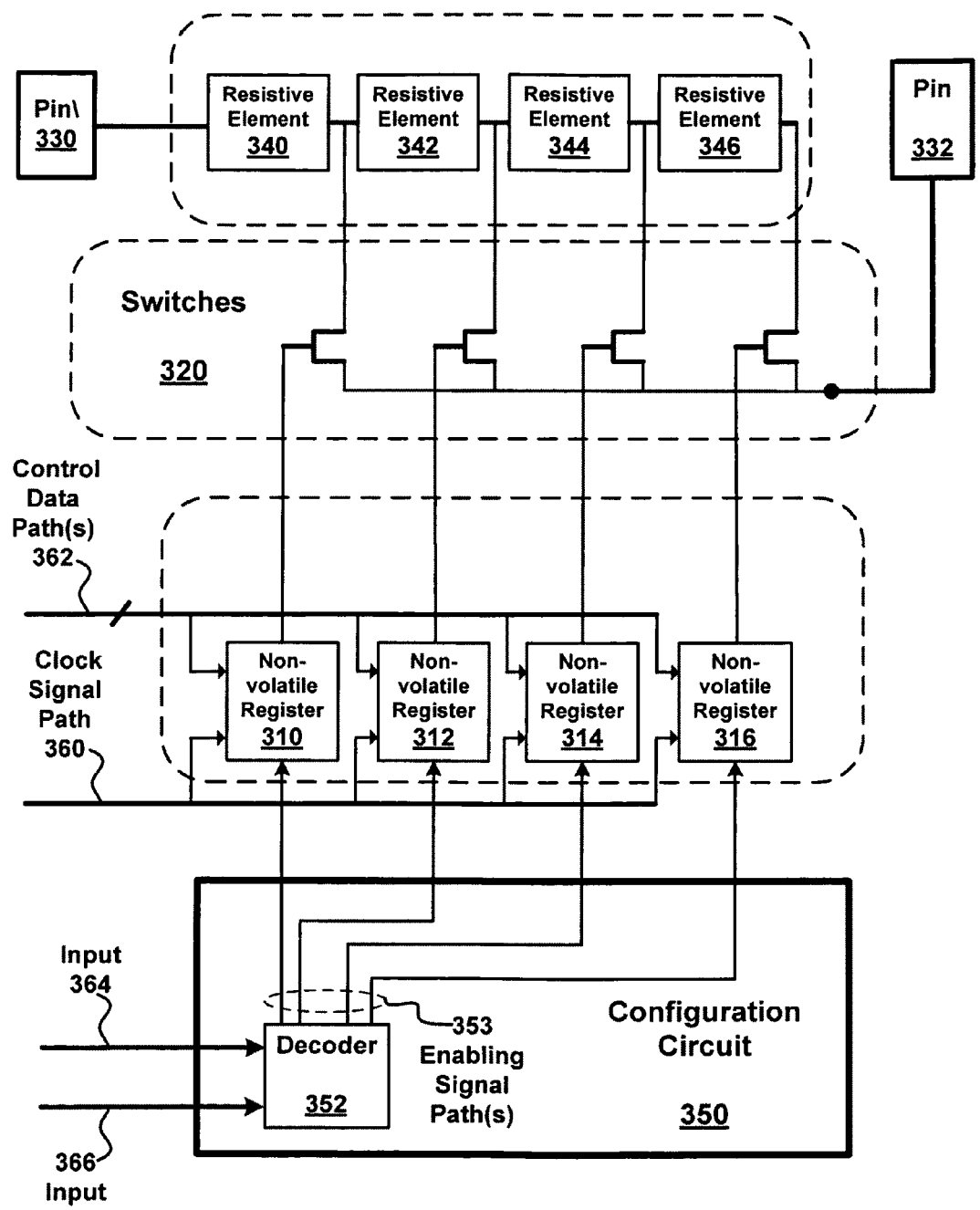
FIG. 3 depicts an alternative example of a digital potentiometer, according to one or more embodiments of the invention.

FIG. 3 depicts an alternative example of a digital potentiometer, according to one or more embodiments of the invention. Here, structure 300 includes non-volatile registers 310-316, switches 320, a pin 330 and a pin 332, resistive elements 340-346, a configuration circuit 350 including a decoder 352, clock data path 360, control data path(s) 362, inputs 364, and 366. While FIG. 3 depicts four resistive elements 340-346 configured electrically in series with one another, in other examples, there may be more or fewer resistive elements coupled to pins 330-332 and the resistive elements may be electrically configured in different configurations.

Configuration circuit 350 may be configured to configure non-volatile registers 310-316. In the example shown, configuration of non-volatile registers 310-316 is controlled by a clock signal on a clock signal path 360, control data on control data path(s) 362, and inputs 362-364. Here, inputs 364-366 feed into decoder 352. Based on inputs 364-366, decoder 352 generates and transmits one or more enable signals on enabling signal path(s) 353 to non-volatile registers 310-316, enabling a register to be programmed with control data on control data path(s) 362. To illustrate the operation of decoder 352, consider that decoder 352 decodes "0" and "0," "0" and "1," "1" and "0," and "1" and "1," as applied to inputs 364 and input 366, respectively, to generate corresponding enabling signals to select non-volatile registers 310, 312, 314, and 316. Decoder 352 can also control a voltage generator circuit (not shown), such as voltage generator circuit 254 of FIG. 2, to apply write and read voltages to at least a selected non-volatile register from of non-volatile registers 310, 312, 314, and 316.

This implementation may be used when the design gets more complex and there are numerous non-volatile registers, and the ring counter technique described in conjunction with configuration circuit 250 of FIG. 2 may not be suitable. In at least some embodiments, non-volatile registers 310-316, switches 320, pins 330 and 332, and resistive elements 340-346 may have similar structures and/or functions to non-volatile registers 210-216, switches 220-226, pins 230 and 232, and resistive elements 240-246, respectively of FIG. 2. In other examples, structure 300 and the above-described elements may be varied and are not limited to the functions, structures, configurations, or implementations provided.

Figure 4A:
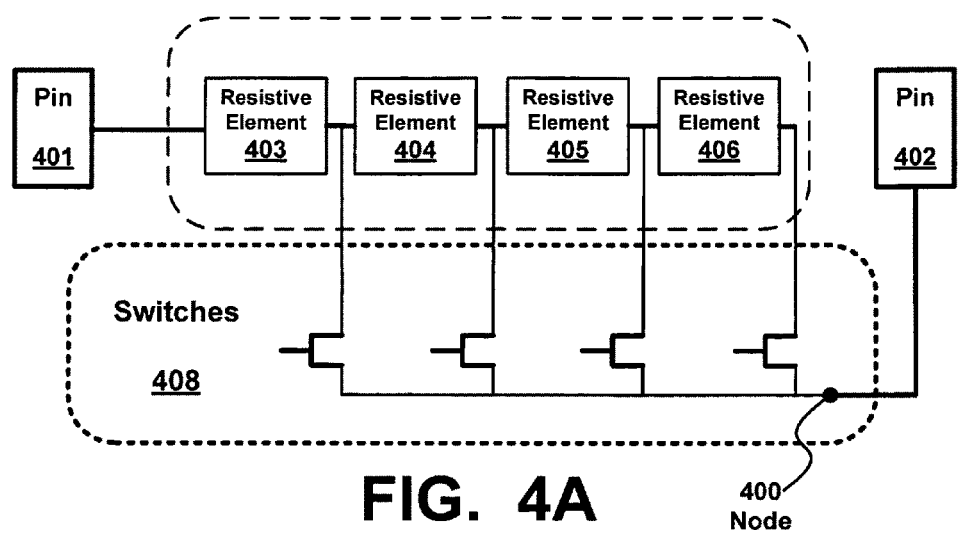
FIGS. 4A to 4G depicts a variety of examples for various configurations of resistive elements, according various embodiments of the invention.

FIGS. 4A to 4G depict a variety of examples for various configurations of resistive elements, according various embodiments of the invention. FIG. 4A depicts one or more of resistive elements 403-406 being configured to provide in the resistive path between pin 401 and pin 402, responsive to an active switch in switches 408. Node 400 is located in the resistive path, according to at least one embodiment, immediately before the resistive path ends at pin 402. Note that resistive elements 403-406 are electrically coupled in series to provide the following selectable resistances between pin 401 and pin 402: R(403), R(403)+R(404), R(403)+R(404)+R(405), and R(403)+R(404)+R(405)+R(406), where R("number") represents the resistance value of the resistive element. In other examples, the above described elements may be varied and are not limited to the functions, structures, configurations, or implementations provided.

Figure 4B:
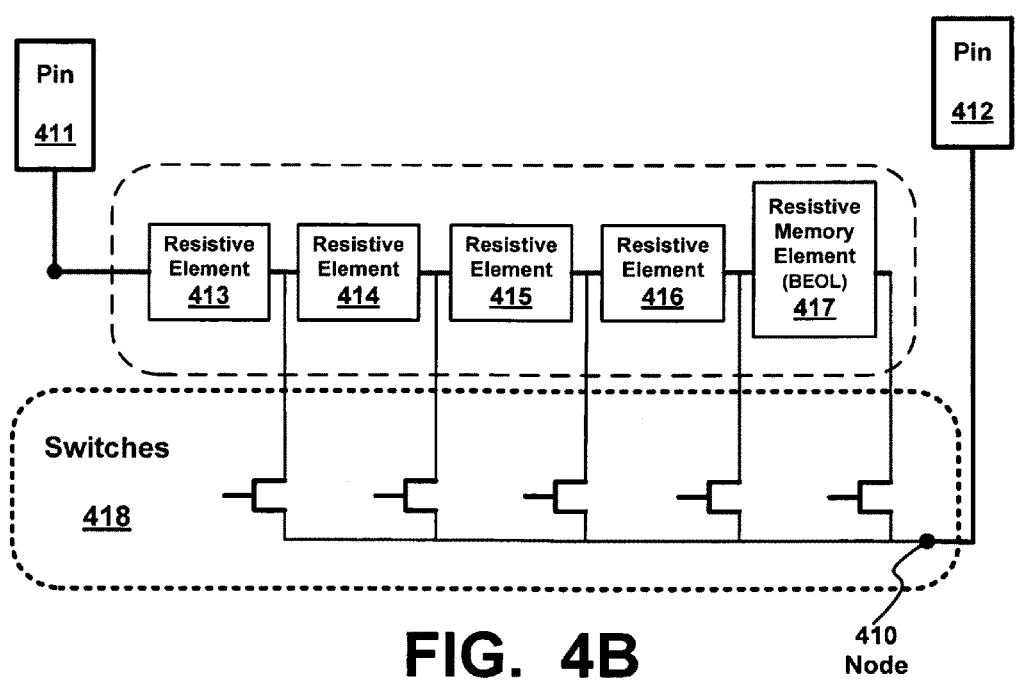

FIG. 4B depicts one or more of resistive elements 413-416 and a resistive memory element 417 from which to select using switches 418 to form the resistive path between pin 411 and pin 412. Node 410 is located in the resistive path, according to at least one embodiment, immediately before the resistive path ends at pin 412. Resistive memory element 417 has an adjustable resistance. In some examples, resistive memory element 417 may include a two-terminal memory element that changes conductivity when exposed to an appropriate voltage differential across the two terminals. Since resistive memory element 417 has an adjustable resistance, the resistance between pin 411 and pin 412 may be fine tuned as a function of the voltage differential, which can be generated by a voltage generator circuit (not shown) that is configured to generate a variable voltage signal. Here, resistive elements 413-416 and resistive memory element 417 are coupled in series and the possible resistances between pin 411 and pin 412 include R(413), R(413)+R(414), R(413)+R(414)+R(415), R(413)+R(414)+R(415)+R(416), and R(413)+R(414)+R(415)+R(416)+R(417), where R("number") represents the resistance value of the resistive element. In other examples, the above-described elements may be varied and are not limited to the functions, structures, configurations, or implementations provided.

Figure 4C:
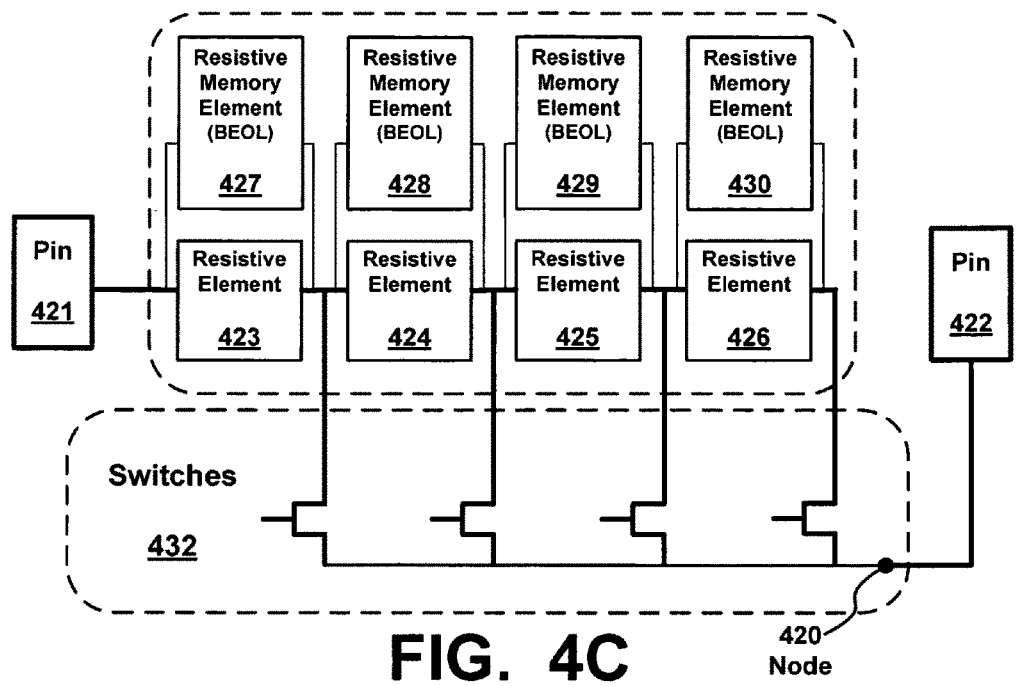

FIG. 4C depicts one or more of resistive elements 423-426 and resistive memory elements 427-430 are selected from switches 432 to form the resistive path between pin 421 and pin 422. Node 420 is located in the resistive path, according to at least one embodiment, immediately before the resistive path ends at pin 422. Resistive memory elements 427-430 have adjustable resistances. In some examples, resistive memory elements 427-430 may include a two-terminal memory element that changes conductivity when exposed to an appropriate voltage differential generated by a voltage generator circuit, which is not shown, across the two terminals. Here, resistive elements are electrically coupled as follows: resistive memory element 427 is coupled in parallel with resistive element 423; resistive memory element 428 is coupled in parallel with resistive element 424; resistive memory element 429 is coupled in parallel with resistive element 425; resistive memory element 430 is coupled in parallel with resistive element 426; and these subsets are all electrically coupled in series. Since resistive memory elements 427-430 have adjustable resistances, the resistance between pin 411 and pin 412 may be fine tuned. Note that resistive memory elements 427-430 can be controlled by switches 432 or a separate set of switches, which are not shown. In other examples, the above-described elements may be varied and are not limited to the functions, structures, configurations, or implementations provided.

Figure 4D:
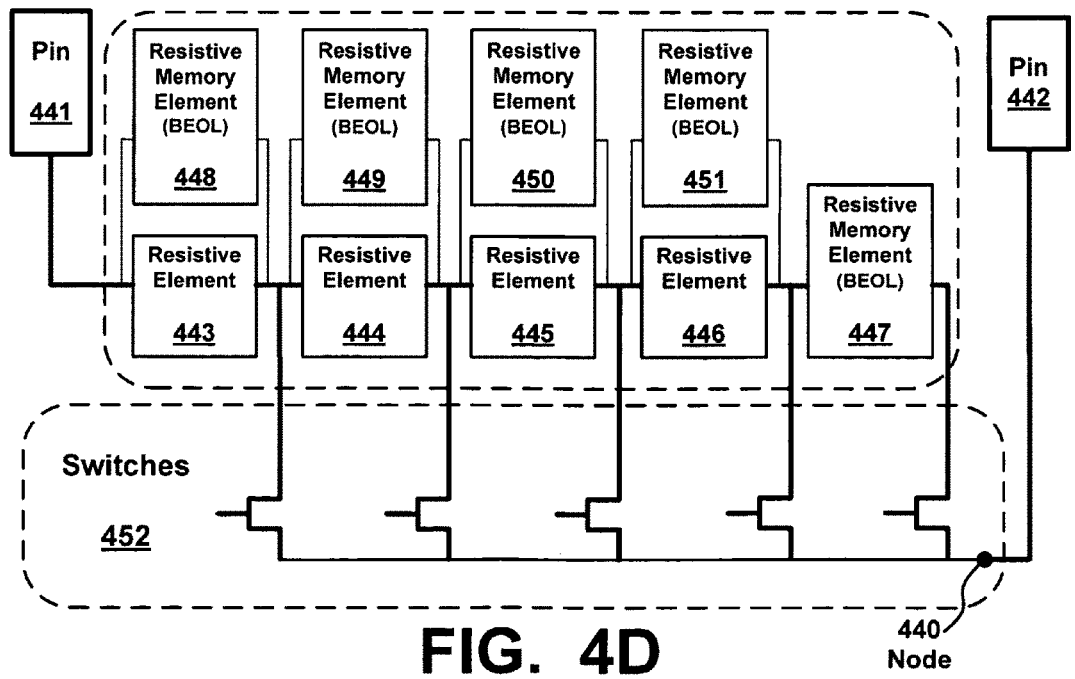

FIG. 4D depicts one or more of resistive elements 443-446 and resistive memory elements 447-441 that can be selected by switches 452 to form the resistive path between pin 441 and pin 442. Node 440 is located in the resistive path, according to at least one embodiment, immediately before the resistive path ends at pin 442. This configuration includes an additional resistive memory element coupled in series to the structure shown in FIG. 4C to provide enhanced fine-tuning of the resistance between pin 441 and pin 442. In other examples, the above-described elements may be varied and are not limited to the functions, structures, configurations, or implementations provided.

Figure 4E:
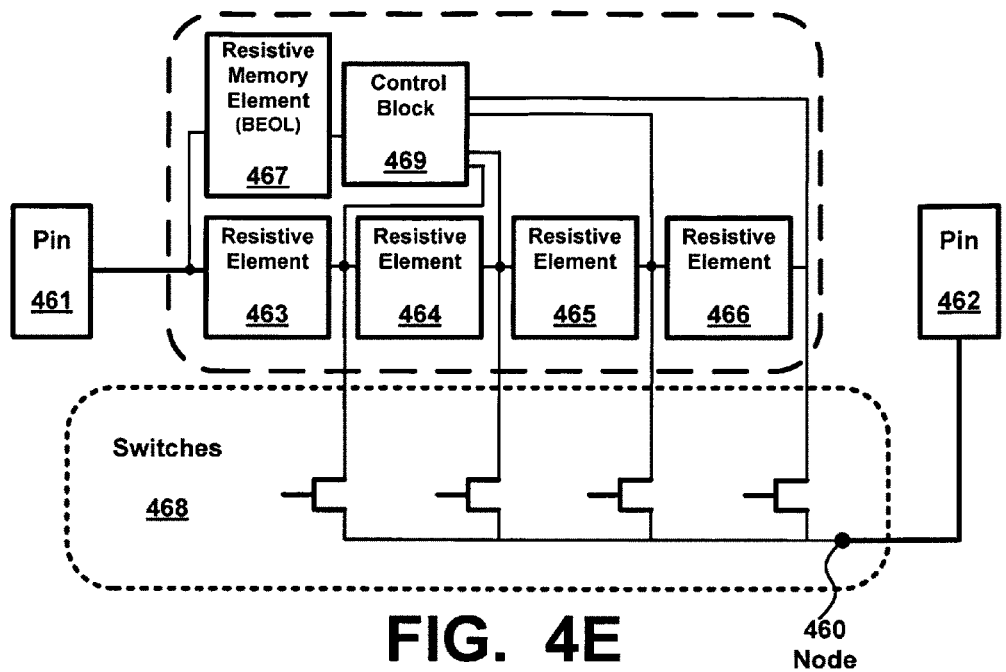

FIG. 4E depicts one or more of resistive elements 463-466 and resistive memory element 467 that can be selected by switches 468 to form the resistive path between pin 461 and pin 462. Node 460 is located in the resistive path, according to at least one embodiment, immediately before the resistive path ends at pin 462. In this example, resistive memory element 467 is coupled in parallel with resistive elements 463-466, which are coupled in series, to provide flexibility in adjusting the resistance between pin 461 and pin 462. Control block 469 may couple resistive memory element 467 to be in parallel with resistive element 463, with resistive elements 463-464, with resistive elements 463-465, or with resistive elements 463-466. In other examples, the above described elements may be varied and are not limited to the functions, structures, configurations, or implementations provided.

Figure 4F:
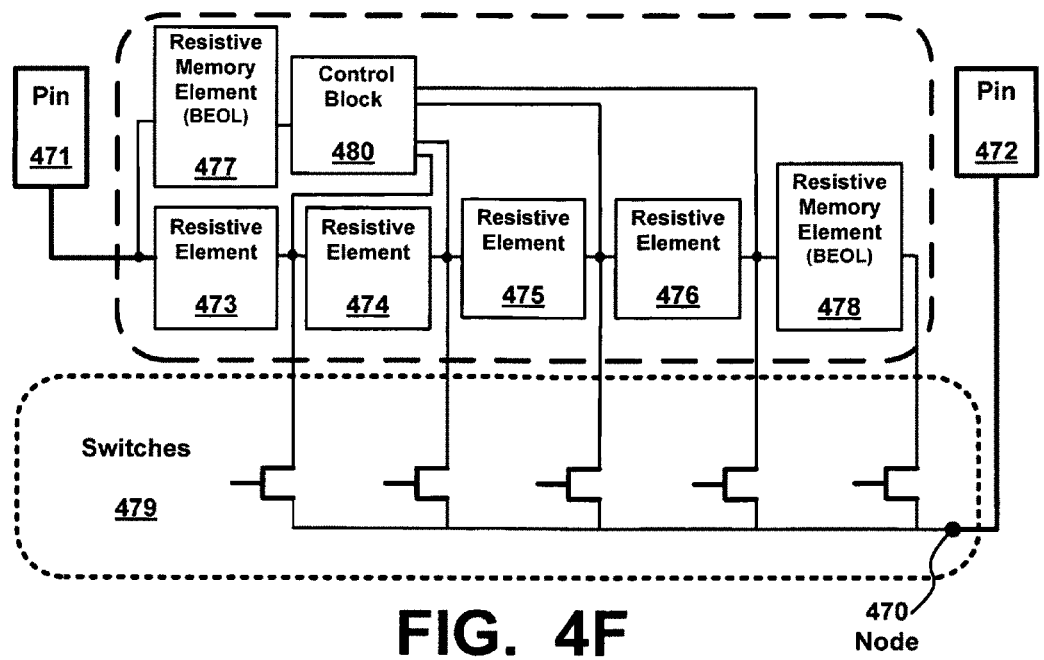

FIG. 4F depicts one or more of resistive elements 473-476, resistive memory element 477, and resistive memory element 478, any of which can be selected by switches 479 to form the resistive path between pin 471 and pin 472. Node 470 is located in the resistive path, according to at least one embodiment, immediately before the resistive path ends at pin 472. Resistive memory element 477 is coupled in parallel with resistive elements 473-476, which are coupled in series, to provide flexibility in adjusting the resistance between pin 471 and pin 472. Control block 480 may be configured to electrically couple resistive memory element 477 to be in parallel with resistive element 473, with resistive elements 473-474, with resistive elements 473-475, or with resistive elements 473-476. Here, the configuration of resistive elements includes an additional resistive memory element 478 coupled in series to provide further flexibility for fine-tuning the resistance between pin 471 and pin 472. In other examples, the above-described elements may be varied and are not limited to the functions, structures, configurations, or implementations provided.

Figure 4G:
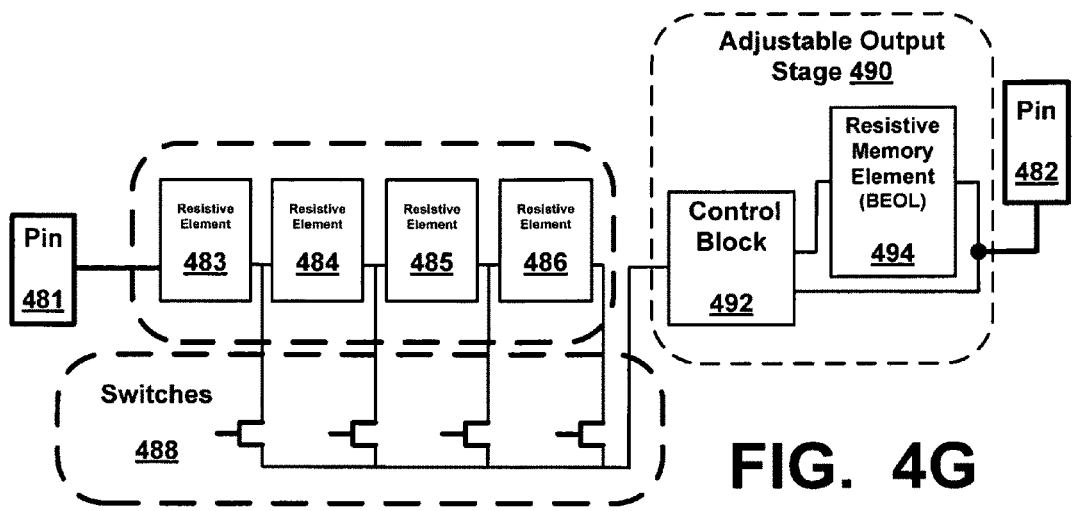

FIG. 4G depicts one or more of resistive elements 483-486 being configured to provide in the resistive path between pin 481 and pin 482, responsive to an active switch in switches 488. Note that resistive elements 483-486 are coupled in series to provide the following selectable resistances between pin 481 and pin 482: R(483), R(483)+R(484), R(483)+R(484)+R(485), and R(483)+R(484)+R(485)+R(486), where R("number") represents the resistance value of the resistive element. Further, adjustable output stage 490 may be inserted as the last stage for fine-tuning the resistance. Control block 492 controls whether the resistive path between pin 481 and pin 482 includes resistive memory element 494 or not. If the resistive path does not include resistive memory element 494, the possible selectable resistances between pin 481 and pin 482 are as listed above and unchanged. If the resistive path includes resistive memory element 494, R(494) is added to the resistive path. Thus, four additional selectable resistance between pin 481 and pin 482 are added: R(483)+R(494), R(483)+R(484)+R(494), R(483)+R(484)+R(485)+R(494); and R(483)+R(484)+R(485)+R(486)+R(494). Adjustable output stage 490 may also be added to FIGS. 4A to 4F, at nodes 400, 410, 420, 440, 460, and 470, respectively, providing more flexibility for fine-tuning the resistance. In other examples, the above-described elements may be varied and are not limited to the functions, structures, configurations, or implementations provided.

Figure 5:
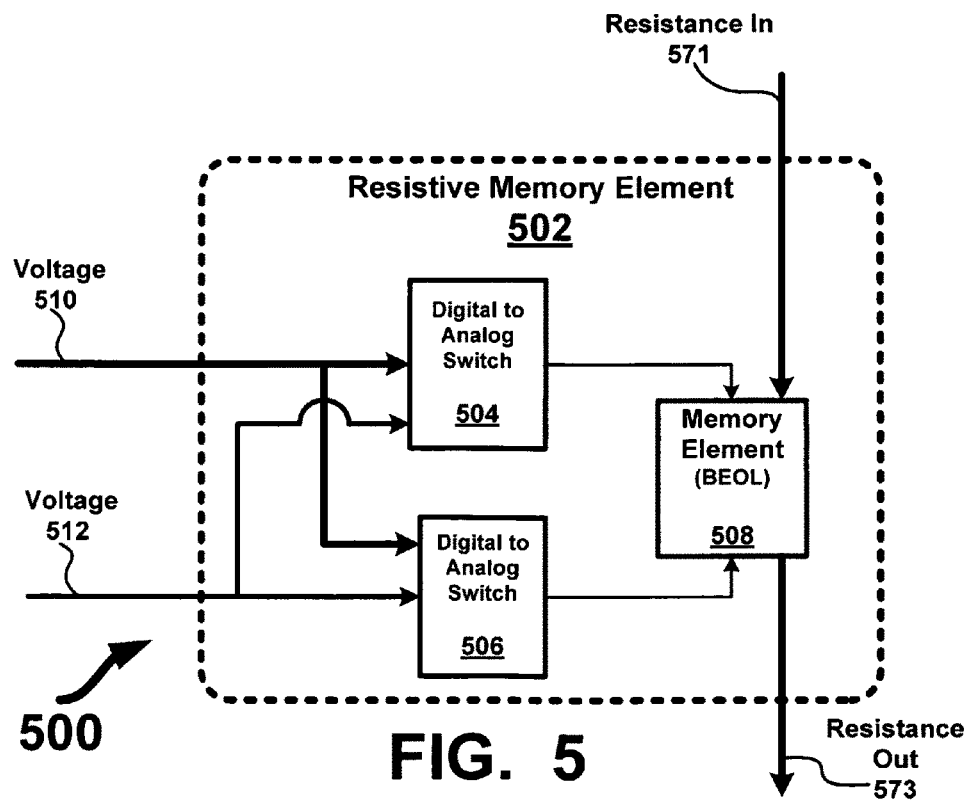
FIG. 5 depicts an example of a resistive memory element, according to one or more embodiments of the invention.

FIG. 5 depicts an example of a resistive memory element, according to one or more embodiments of the invention. Here, structure 500 includes resistive memory element 502, digital-to-analog switches 504-506, memory element 508, and voltages 510-512. Resistive memory element 502 has an adjustable resistance, based on the voltage differential placed across memory element 508. In this example, voltages 510-512 are fed into digital to analog switches 504-506 to create variable voltages to apply to memory element 508. This allows fine adjustments to be made to the voltage differential across memory element 508, resulting in fine adjustments to the adjustable resistance of resistive memory element 502, the adjustable resistance being accessed between an input ("Resistance In") 571 and an output ("Resistance Out") 573.

In other examples, structure 500 and the above-described elements may be varied and are not limited to the functions, structures, configurations, or implementations provided. The memory element 508 in Resistive memory element 502 can be fabricated BEOL; whereas, the digital to analog switches 504-506 can be fabricated FEOL.

In FIGS. 1A-5; the memory elements can be fabricated BEOL, the non-volatile memory portion of the non-volatile registers can be fabricated BEOL, and optionally the resistive elements can be fabricated BEOL. Some or all of the active circuitry portions of those figures can be fabricated FEOL. The BEOL portions can be used exclusively for digital potentiometers or can be used for digital potentiometers and non-volatile data storage (e.g., RAM).

Figure 6:
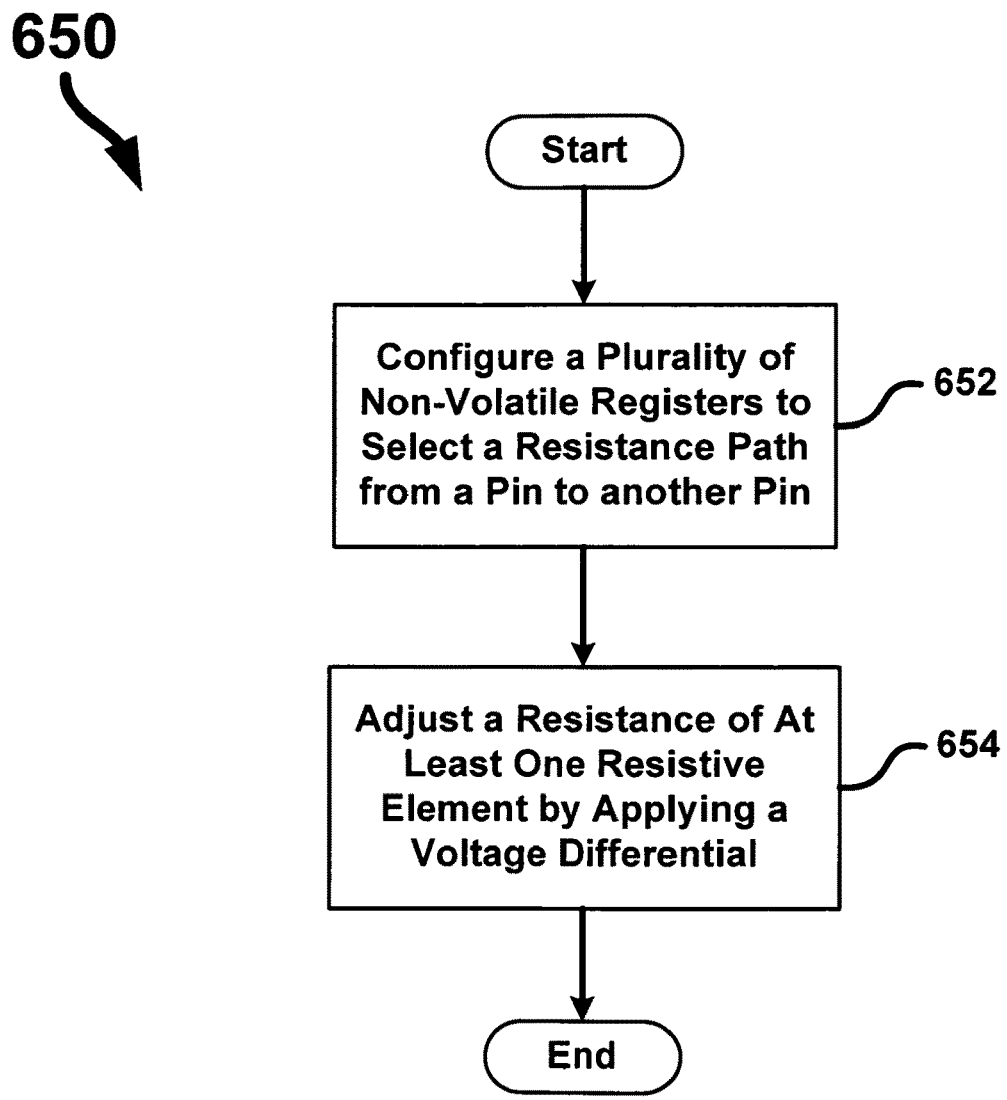
FIG. 6 depicts an example of a process for programming a digital potentiometer, according to one or more embodiments of the invention.

FIG. 6 depicts an exemplary process for programming a digital potentiometer, according to one or more embodiments of the invention. Here, process 650 starts by configuring a plurality of non-volatile registers at a stage 652 to select a resistance path including selecting one or more resistive elements from a pin to another pin. In some examples, resistance paths may be selected from configurations as shown in FIG. 4A, FIG. 4B, FIG. 4C, FIG. 4D, FIG. 4E, and FIG. 4F. In other examples, resistance paths may be selected from another configuration of resistive elements and resistive memory elements. Resistance of at least one of the resistive memory elements may be adjusted by applying a voltage differential at a stage 654 to the resistive memory element. In some examples, the resistive memory element may include a two-terminal memory element that changes conductivity when exposed to an appropriate voltage differential across the two terminals. To achieve the voltage differential across the two terminals, multiple write signals may be generated. Then the multiple write signals may be applied to any of a number of memory planes to adjust the resistance of the memory element. In other examples, the above-described process may be varied and is not limited to the processes or sub-processes described above.

Figure 6A:
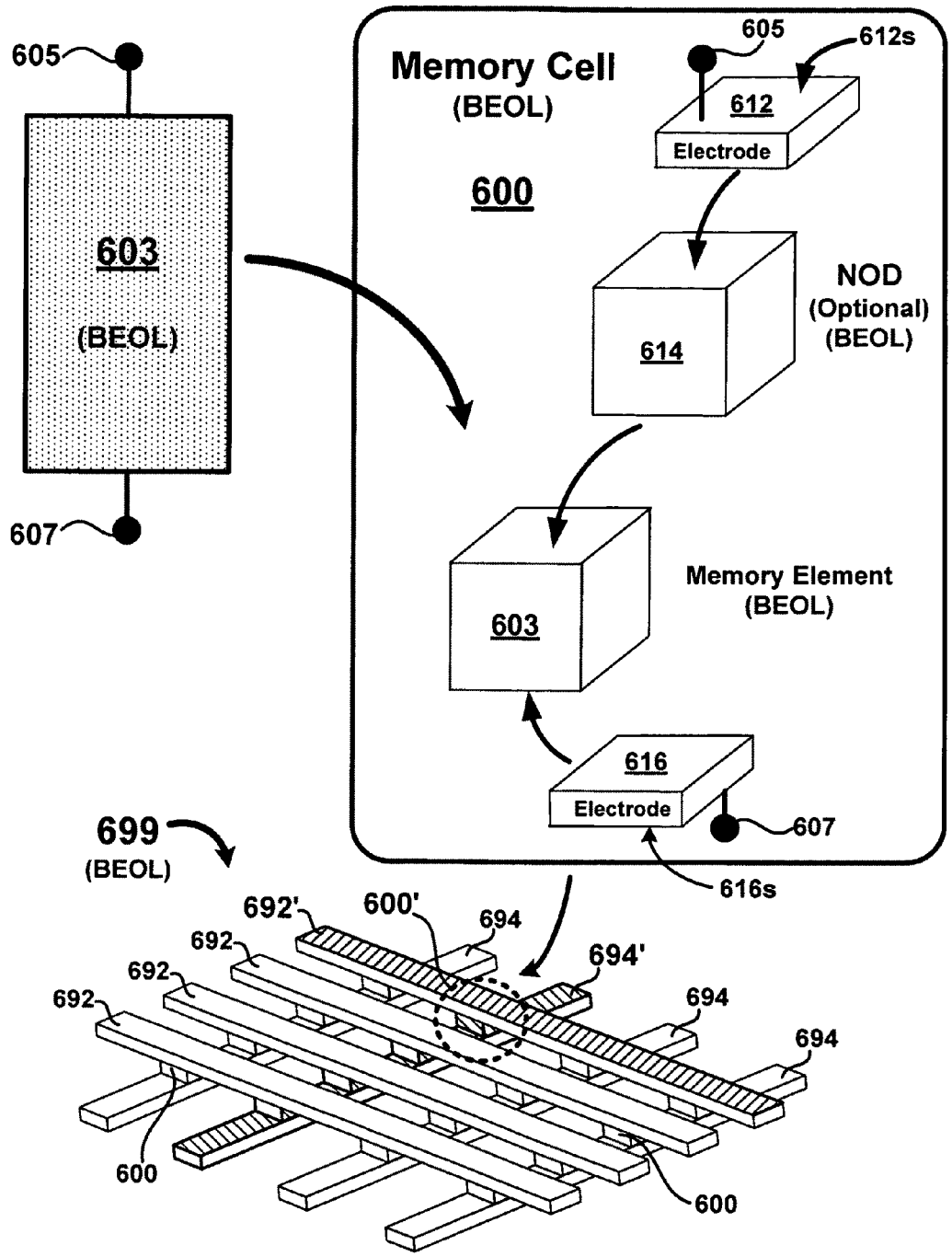
FIG. 6A depicts an example of memory cells positioned in a two terminal cross-point array.

FIG. 6A depicts an example of arrayed memory cells according to various embodiments of the invention. In this example, a non-volatile re-writable memory cell 600 can be used to implement the aforementioned non-volatile memory elements. The memory cell 600 includes a memory element 603 and terminals 605 and 607 with the memory element 603 electrically in series with the terminals 605 and 607. Terminals 605 and 607 can be electrically coupled with or can be formed as electrodes 612 and 616. The electrodes (612, 616) can be made from an electrically conductive material including but not limited to, platinum (Pt), gold (Au), silver (Ag), iridium (Ir), iridium oxide (IrO$_x$), ruthenium (Ru), palladium (Pd), aluminum (Al), and the like.

In at least some embodiments, memory cell 600 can include an optional non-ohmic device (NOD) 614, which, in turn, can be formed on the memory element 603 (e.g., either above or below memory element 603). NOD 614 can be a "metal-insulator-metal" (MIM) structure that includes one or more layers of electronically insulating material that are in contact with one another and sandwiched between metal layers (e.g., electrodes), or NOD 614 can be a pair of diodes connected in a back-to-back configuration. U.S. patent application Ser. No. 11/881,473, filed Jul. 26, 2007, now U.S. Published Application No. 2009/0027976, and entitled "Threshold Device For A Memory Array" and U.S. patent application Ser. No. 12/283,339, filed Sep. 11, 2008, now U.S. Published Application No. 2009/0016094 and entitled "Selection Device for Re-Writable Memory" are both hereby incorporated by reference in their entirety and for all purposes and describe metal-insulator-metal and diode based non-ohmic devices. NOD 614 can be another type of selection device and the present invention is not limited to the examples disclosed herein. The NOD 614 and the memory element 603 are electrically in series with each other and with the terminals 605 and 607. Memory cell 600 can be formed between conductive array lines, such as array lines 692 and 694. Thus, memory cell 600 can be formed in an array of other memory cells. A configuration of the array (e.g., number of rows and columns) can depend in part on the number of non-volatile memory elements are required for a specific application. For example, if 500 non-volatile memory elements are required, then the array would include at least 500 of the memory cells 600. Portions of the array can be used to implement the non-volatile memory elements and other portions of the array can be used for data storage purposes with each portion having a different address space in a memory map. The array can be a cross-point array 699 including a plurality of the conductive array lines 692 and 694, and a plurality of the memory cells 600. For example, array lines 692 can be electrically coupled with the electrodes 612 of the memory cells 600 and/or may be in contact with a surface 612s of the electrodes 612 and array lines 694 can be electrically coupled with the electrodes 616 of the memory cells 600 and/or may be in contact with a surface 616s of the electrodes 616. A memory cell 600' is selected for a data operation (e.g., read or write operation) by applying select voltages (e.g., read voltages, write voltages, program voltages, or erase voltages) to its respective conductive array lines 692' and 694'.

Figure 7:
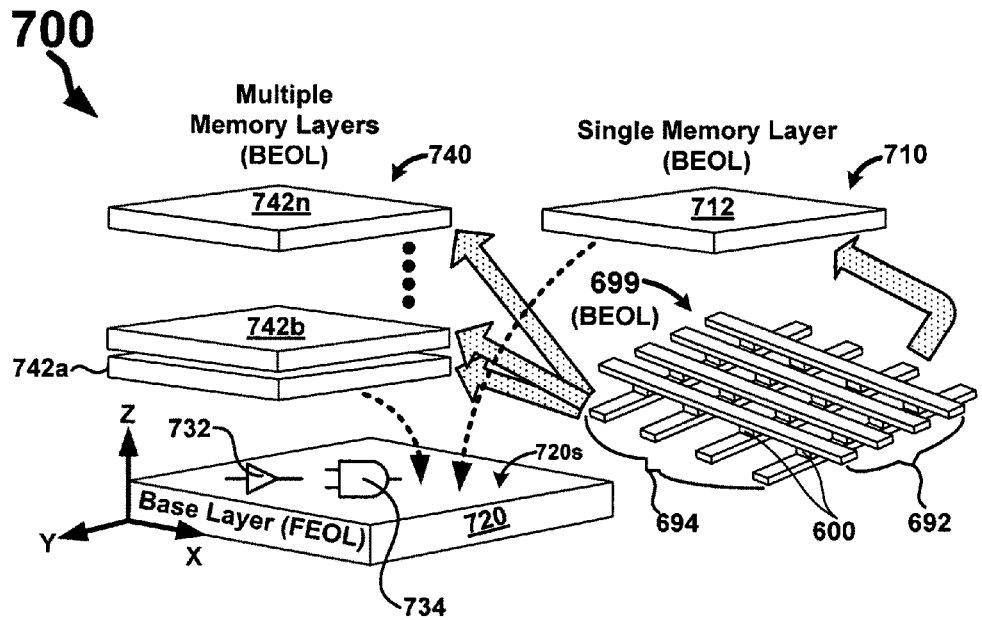
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 700 can include non volatile and re-writable memory cells 600 disposed in a single layer 710 or in multiple layers 740 of memory, according to various embodiments of the invention. The single 710 or multiple 740 layers of memory can be fabricated BEOL. In this example, integrated circuit 700 is shown to include either multiple layers 740 of memory (e.g., layers 742a, 742b, . . . 742n) or a single layer 710 of memory 712 formed on (e.g., fabricated above) a base layer 720 (e.g., a silicon wafer). The base layer 720 can be fabricated FEOL with the single or multiple layers of memory 710 and/or 740 fabricate BEOL on top of the base layer 720. In at least some embodiments, each layer of memory (712, or 742a, 742b, . . . 742n) can include the cross point array 699 fabricated (e.g., BEOL) and having conductive array lines (692, 694) arranged in different directions (e.g., substantially orthogonal to one another) to access memory cells 600 (e.g., two-terminal memory cells). For example, conductors 692 can be X-direction array lines (e.g., row conductors) and conductors 694 can be Y-direction array lines (e.g., column conductors). Base layer 720 (e.g., substrate 602 in FIG. 6) can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 732 and 734 are fabricated. The active circuitry 732 and 734 includes analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
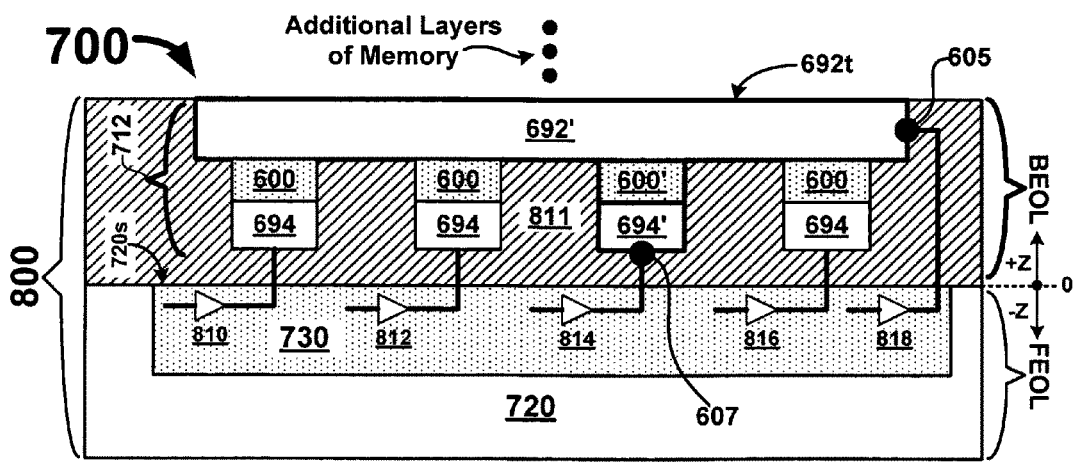
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 732 and 734 fabricated FEOL on the base layer 720. As one example, the base layer 720 can be a silicon (Si) wafer and the active circuitry 732 and 734 can be microelectronic devices formed on the base layer 720 using a CMOS fabrication process. The memory cells 600 and their respective conductive array lines (692, 694) can be fabricated on top of (e.g., above an upper surface 720s of base layer 720) the active circuitry 732 and 734 in the base layer 720. Those skilled in the art will appreciate that an inter-level interconnect structure (not shown) can electrically couple the conductive array lines (692, 694) with the active circuitry 732 and 734 which may include several metal layers. For example, vias can be used to electrically couple the conductive array lines (692, 694) with the active circuitry 732 and 734. Here, the upper surface 720s can comprise the upper surface of the inter-level interconnect structure. The active circuitry 732 and 734 may include but is not limited to address decoders, sense amps, memory controllers, data buffers, direct memory access (DMA) circuits, voltage sources for generating the read and write voltages, just to name a few. For example, active circuits 810-818 can be configured to apply the select voltage potentials (e.g., read and write voltage potentials) to selected conductive array lines (692', 694') for selected memory cell 600' via terminals 605 and 607 that are electrically coupled with outputs of active circuits 814 and 818 respectively. Moreover, active circuits 810-818 may be coupled with the conductive array lines (692', 694') to sense the read current $I_R$ from selected memory cells 600' during a read operation and the sensed current can be processed by active circuits 810-818 to determine the conductivity profiles (e.g., the resistive state) of the selected memory cells 600'. In some applications, it may be desirable to prevent un-selected array lines (692, 694) from floating. The active circuits 810-818 can be configured to apply a un-select voltage potential (e.g., approximately a ground potential) to the un-selected array lines (692, 694). A dielectric material 811 (e.g., $SiO_2$) may be used where necessary to provide electrical insulation between elements of the integrated circuit 700.

Figure 8B:
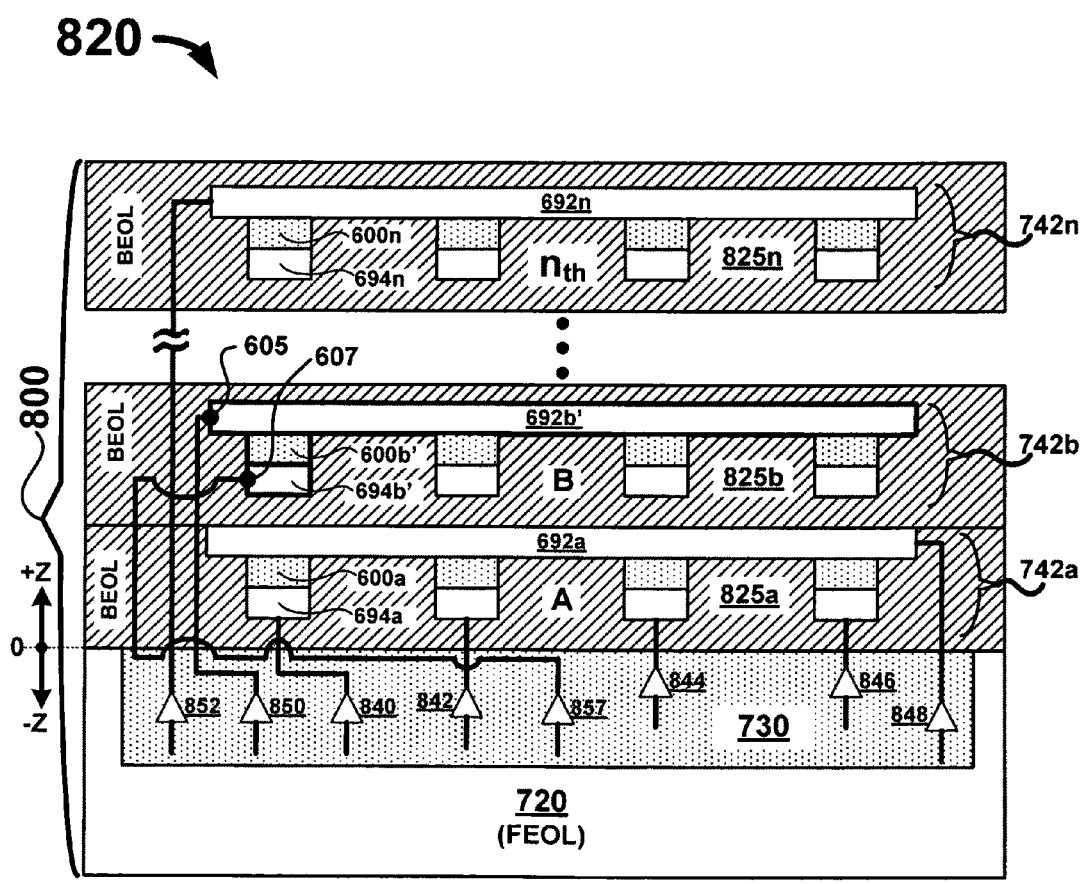
FIG. 8B depicts a cross-sectional view of an integrated circuit including vertically stacked layers of memory fabricated over a substrate including active circuitry fabricated in a logic layer.
Figure 9:
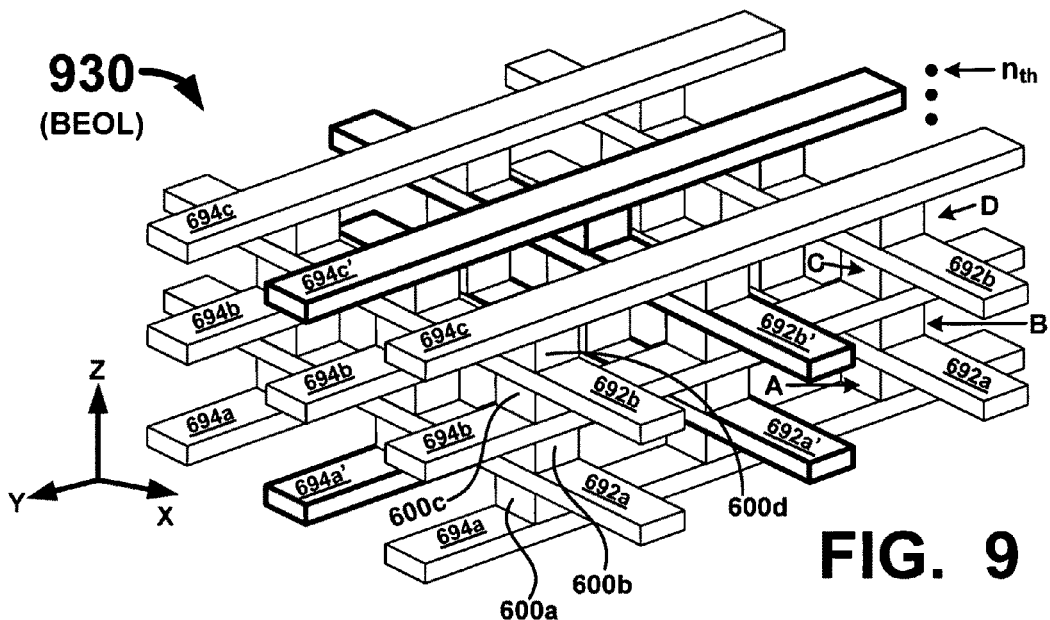
FIG. 9 depicts a vertically stacked layers of memory in which conductive array lines are shared by memory cells in adjacent layers.
Figure 10:
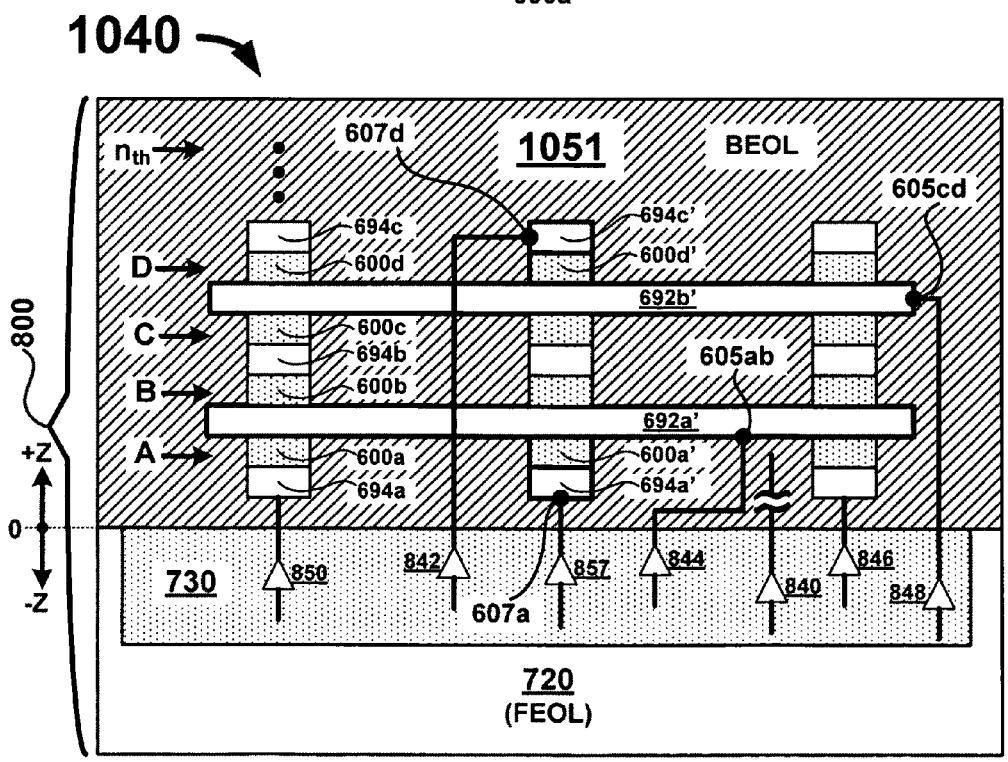
FIG. 10 depicts an integrated circuit including vertically stacked layers of memory with shared conductive array lines fabricated over a substrate including active circuitry fabricated in a logic layer.

Although only a single layer of memory 712 is depicted in FIG. 8A, additional layers of memory (e.g., 742a-742n) can be vertically fabricated BEOL above an upper surface 692t of conductive array line 692 to form a multi-layer cross-point memory array. The vertically stacked layers of memory can have electrically isolated conductive array lines as depicted in FIGS. 6A, 8A, and 8B, or can have shared conductive array lines as depicted in FIGS. 9 and 10. Whether a single layer 712 or multiple layers 742a-742n, the connected combination of the base layer 720 and the memory layer(s) comprises a die 800 that can be one of a plurality of die 800 on a substrate such as a silicon wafer or a die 800 that has been sigulated (e.g., cut) from the substrate as will be described in greater detail below in regards to FIG. 11.

Turning now to FIG. 8B, an integrated circuit 820 includes a plurality of non-volatile memory arrays 742a, 742b, . . . 742n that are vertically stacked above one another (e.g., along the +Z axis) and are positioned above the base layer 720 that includes the active circuitry 730. Collectively, the FEOL base layer 720 and the plurality of non-volatile BEOL memory arrays 742a, 742b, . . . 742n can be referred to as a die 800. The integrated circuit 820 includes vertically stacked memory layers A and B and may include additional memory layers up to an nth memory layer. The memory layers A, B, . . . through the nth layer can be electrically coupled with the active circuitry 730 in the base layer 720 by an inter-level interconnect structure as was described above. Layer A includes memory cells 600a and first and second conductive array lines (692a, 694a), Layer B includes memory cells 600b and first and second conductive array lines (692b, 694b), and if the nth layer is implemented, then the nth layer includes memory cells 600n and first and second conductive array lines (692n, 694n). Dielectric materials 825a, 825b, and 825n (e.g., $SiO_2$) may be used where necessary to provide electrical insulation between the memory layers and memory elements of the integrated circuit 820. Active circuits 840-857 can be configured to apply the select voltage potentials (e.g., read and write voltage potentials) to selected conductive array lines (e.g., 692*a*, *b*, . . . n, and 694*a*, *b*, . . . n). Driver circuits 850 and 857 are activated to select conductive array lines 692' and 694' to select memory cell 600*b*' for a data operation. As was described above, the active circuits 730 can be used to sense the read current $I_R$ from selected memory cells 600*b*' during a read operation and can be configured to apply the un-select voltage potential to the un-selected array lines.

Attention is now directed to FIG. 9, where a vertically stacked array 930 includes a plurality of memory layers A,B, C, and D with each memory layer including memory cells 600*a*, 600*b*, 600*c*, and 600*d*. Although only four layers are depicted, the array 930 can include additional layers up to an nth layer. The array 930 includes two levels of x-direction conductive array lines 692*a* and 692*b*, and three levels of y-direction conductive array lines 694*a*, 694*b*, and 694*c*. In contrast to the integrated circuit 820 depicted in FIG. 8B where each array layer is electrically isolated from other layers by a dielectric material (825*a*, 825*b*, . . . 825*n*), each memory cell 600*a*, 600*b*, 600*c*, and 600*d* shares a conductive array line with other memory cells that are positioned above, below, or both above and below that memory cell. Conductive array lines 692*a*' and 694*a*' select a memory cell 600*a*' for a data operation, and conductive array lines 692*b*' and 694*c*' select a memory cell 600*d*' for a data operation (see FIG. 10).

In FIG. 10, an integrated circuit 1040 includes base layer 720, active circuitry 730, and vertically staked memory layers A, B, C, and D that are fabricated above the base layer 720. Collectively, the FEOL base layer 720 and the plurality of non-volatile BEOL memory layers A, B, C, and D can be referred to as a die 800. Active circuits 840-857 are configured to perform data operations on the vertically staked memory layers A, B, C, and D. Driver circuits 844 and 857 are activated to select memory cell 600*a*' for a data operation and driver circuits 842 and 848 are activated to select memory cell 600*d*' for a data operation. A dielectric layer 1051 is operative to electrically isolate the various components of integrated circuit 1040.

Figure 11:
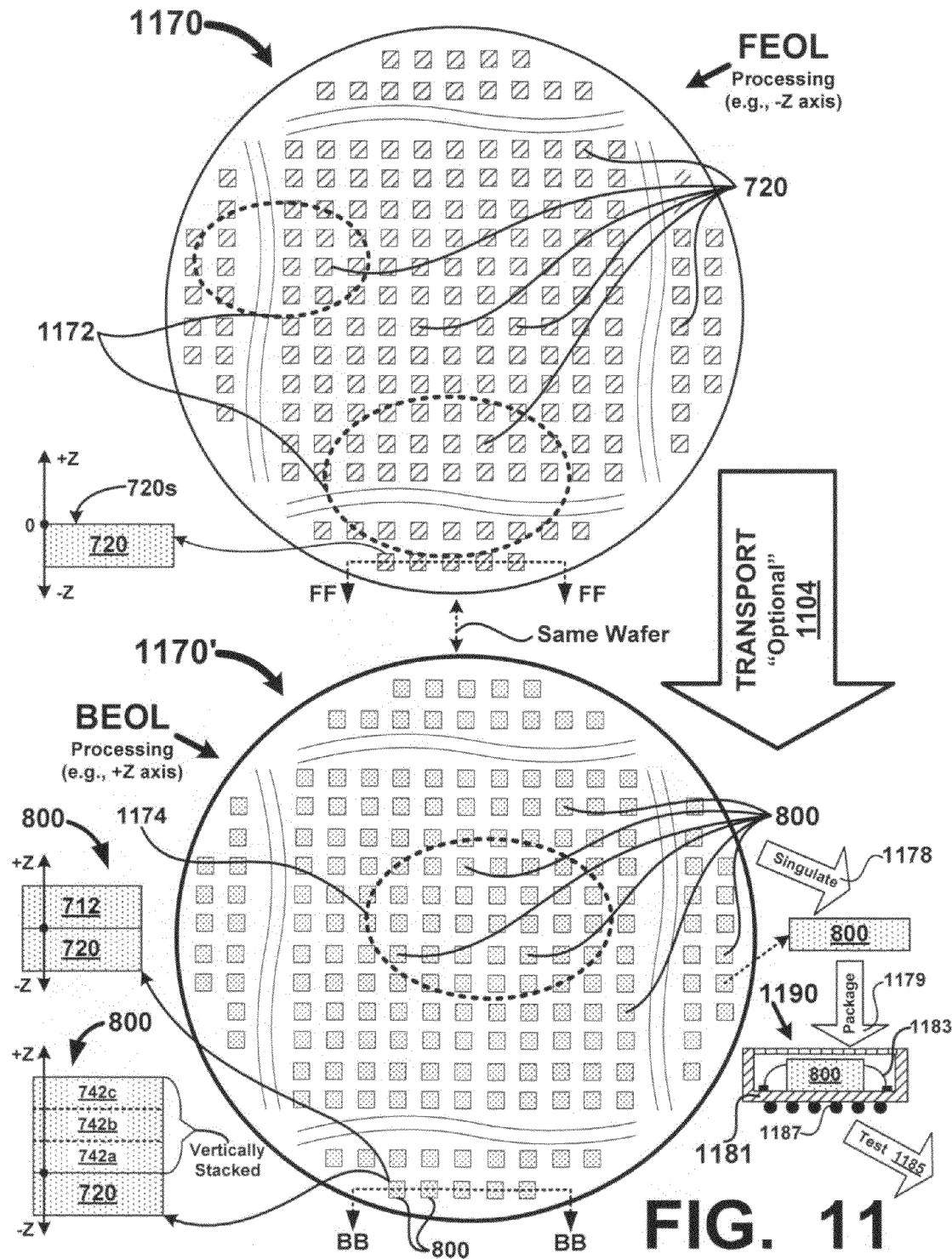
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742*a*, 742*b*, . . . 742*n*) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720*s* of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 10) that includes the FEOL circuitry portion 720 along the −Z axis and the BEOL memory portion along the +Z axis (see FIGS. 8A-10). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742*a*, 742*b*, and 742*c* grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield.

One or more of the IC's 1190 can be used in systems including but not limited to data storage systems, a system requiring non-volatile memory, a system requiring emulation of one or more memory types as described above. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation and/or other FLASH operations are eliminated.

The foregoing examples have been described in some detail for purposes of clarity of understanding, but are not limited to the details provided. There are many alternative ways and techniques for implementation. The disclosed examples of the various embodiments of the invention are illustrative and not restrictive.

What is claimed is:
1. A digital potentiometer, comprising:
 a silicon die including a front-end-of-the-line (FEOL) portion and a back-end-of-the-line (BEOL) portion vertically fabricated above and in direct contact with the FEOL portion;
 active circuitry included in the FEOL portion and fabricated FEOL on a semiconductor surface the silicon die;
 an interconnect structure included in the FEOL portion and fabricated FEOL above the active circuitry and including a plurality of electrical structures electrically coupled with at least a portion of the active circuitry;

a plurality of re-writeable non-volatile memory elements (ME's) included in the BEOL portion and integrally vertically fabricated directly above the interconnect structure, each ME having exactly two terminals, each ME configured to store a resistive state as one of a plurality of conductivity profiles that are retained in the absence of electrical power and are reversibly re-writeable by applying a write voltage across the two terminals of the ME;

a switch included in the active circuitry and configured to electrically couple one or more of the ME's with a first pin and a second pin; and a non-volatile register including FEOL elements and BEOL elements, the FEOL elements comprise register logic included in a sub-portion of the active circuitry and the BEOL elements comprise one or more of the ME's electrically coupled with the register logic through a subset of the plurality of electrical structures in the interconnect structure, the non-volatile register electrically coupled with the switch and configured to control the switch.

2. The digital potentiometer of claim 1, wherein at least one of the ME's includes an adjustable resistance.

3. The digital potentiometer of claim 1, wherein a resistance of each ME that is not included in the non-volatile register is adjustable as a function of a voltage differential applied across the two terminals of the ME.

4. The digital potentiometer of claim 3, wherein the voltage differential is formed by generating multiple write signals.

5. The digital potentiometer of claim 3 and further comprising:
a voltage generator circuit included in the active circuitry and electrically coupled with each ME that is not included in the non-volatile register is and operative to generate the voltage differential using the multiple write signals.

6. The digital potentiometer of claim 1 and further comprising:
a plurality of BEOL memory layers that are in contact with one another and are included in the BEOL portion, and the ME's are distributed among the plurality of BEOL memory layers.

7. The digital potentiometer of claim 1, wherein a subset of the plurality of ME's are electrically coupled in series.

8. The digital potentiometer of claim 1, wherein a subset of the ME's are electrically coupled in parallel.

9. The digital potentiometer of claim 1, wherein a first subset of the ME's are electrically coupled in series and second subset of the ME's are electrically coupled in parallel.

10. A digital potentiometer, comprising:
a silicon die including a front-end-of-the-line (FEOL) portion and a back-end-of-the-line (BEOL) portion vertically fabricated above and in direct contact with the FEOL portion;
active circuitry included in the FEOL portion and fabricated FEOL on a semiconductor surface the silicon die;
an interconnect structure included in the FEOL portion and fabricated FEOL above the active circuitry and including a plurality of electrical structures electrically coupled with at least a portion of the active circuitry;
a plurality of re-writeable non-volatile memory elements (ME's) included in the BEOL portion and integrally vertically fabricated directly above the interconnect structure, each ME having exactly two terminals, each ME configured to store a resistive state as one of a plurality of conductivity profiles that are retained in the absence of electrical power and are reversibly re-writeable by applying a write voltage across the two terminals of the ME;

a first pin;
a second pin;
a plurality of switches included in the active circuitry, at least one of the plurality of switches configured to electrically couple at least one of the ME's with the first pin and the another second pin; and
a non-volatile register including FEOL elements and BEOL elements, the FEOL elements comprise register logic included in a sub-portion of the active circuitry and the BEOL elements comprise one or more of the ME's electrically coupled with the register logic through a subset of the plurality of electrical structures in the interconnect structure, the non-volatile register electrically coupled with the plurality of switches and the non-volatile register configured to control the at least one of the plurality of switches.

11. The digital potentiometer of claim 10, wherein at least one of the ME's has an adjustable resistance.

12. The digital potentiometer of claim 10, wherein at least one of the ME's is a resistive memory element and a resistance of the ME is adjustable as a function of a voltage differential applied across the two terminals of the ME.

13. The digital potentiometer of claim 10, wherein the BEOL portion includes at least one vertically stacked memory layer and the ME's in each memory layer are formed in at least one BEOL two-terminal cross-point array.

14. A method for programming a digital potentiometer, comprising:
configuring a plurality of non-volatile registers to select a resistance path including one or more resistive elements from a first pin to a second pin, each resistive element having exactly two terminals, each non-volatile register including a back-end-of-the-line (BEOL) non-volatile memory portion that includes the one or more resistive elements and a front-end-of-the-line (FEOL) register logic portion fabricated FEOL in a FEOL portion on a semiconductor surface of a silicon die; and
applying a voltage differential to adjust the resistance of at least one of the one or more resistive elements.

15. The method of claim 14, wherein applying the voltage differential comprises, generating multiple write signals, and applying the multiple write signals to at least one memory plane in a plurality of BEOL memory planes the plurality of BEOL memory planes are in contact with the silicon die and are vertically fabricated directly above the FEOL portion.

16. The method of claim 15, wherein the multiple write signals comprises applying the multiple write signals to different memory planes in the plurality of BEOL memory planes, wherein a first BEOL memory plane includes the at least one of the one or more resistive elements.

17. The method of claim 14, wherein configuring the plurality of non-volatile registers comprises loading the plurality of non-volatile registers using a ring counter.

18. The method of claim 14, wherein configuring the plurality of non-volatile registers comprises loading the plurality of non-volatile registers using a decoder.

19. The method of claim 14, wherein the plurality of non-volatile registers includes active circuitry in the FEOL portion that is electrically coupled with the BEOL non-volatile memory portion, the BEOL non-volatile memory portion is vertically positioned above and is in direct contact with the silicon die.

\* \* \* \* \*